May 15, 1962 W. SCHMIDT 3,035,213

FLIP FLOP DIODE WITH CURRENT DEPENDENT CURRENT AMPLIFICATION

Filed June 22, 1959

Inventor.
Werner Schmidt.

By. [signature] Atty.

United States Patent Office 3,035,213
Patented May 15, 1962

3,035,213

FLIP FLOP DIODE WITH CURRENT DEPENDENT CURRENT AMPLIFICATION

Werner Schmidt, Munich, Germany, assignor to Siemens and Halske Aktiengesellschaft Berlin and Munich, a corporation of Germany Filed June 22, 1959, Ser. No. 821,787
Claims priority, application Germany July 10, 1958
6 Claims. (Cl. 317—234)

This invention relates to a flip flop diode with current dependent current amplification and is particularly concerned with a semiconductor arrangement having four serially related semiconducting zones with alternately different conduction type, wherein at least one zone and particularly both outer zones exhibit lower conductivity than the respectively adjacent inner zones.

Figure 1:
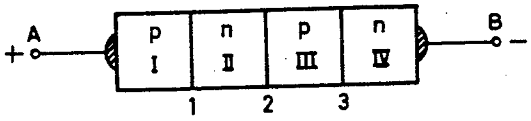
Figure 2:
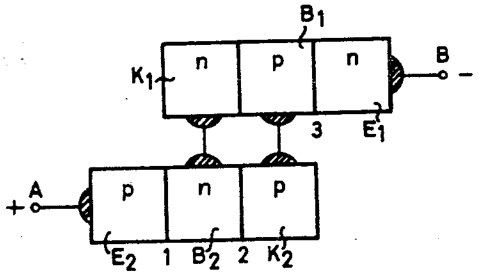
Figure 3:
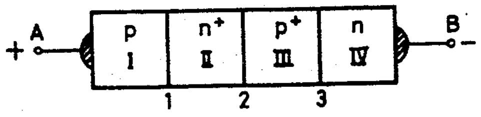
Figure 4:
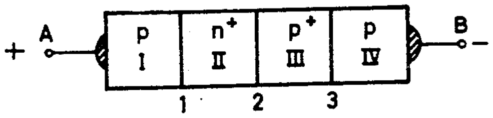

The various objects and features of the invention will appear in the course of the description which will be rendered below with reference to the accompanying drawing, wherein FIG. 1 shows a known p-n-p-n flip flop diode;

FIG. 2 illustrates the arrangement of FIG. 1 for explanatory purposes as consisting of two interconnected transistors; and FIGS. 3 and 4 show diodes according to the invention.

Modern control and regulation techniques as well as the communication art frequently require electronic switches. A known switching element such as the n-p-n-p or p-n-p-n flip flop diode which exhibits a behavior similar to the thyratron, that is, negative current-voltage characteristic, comprises four serially related semiconducting zones of different conduction type.

The structure of the known p-n-p-n flip flop diode is shown in FIG. 1. The diode has four zones of alternately p- and n- conductive semiconductor material, for example, silicon. For the better understanding of the operation, the diode may be visualized as being constructed of two transistors, namely, a p-n-p and an n-p-n transistor, as shown in FIG. 2, whereby the collector of each transistor is conductively interconnected with the base of the other transistor. Voltage with polarity according to FIG. 1 will be connected in operation to the two terminals A and B and the p-n junction 2 will accordingly be biased in blocking direction. If the shunt current amplification of one transistor in FIG. 2 is designated $\alpha_1$, and that of the other transistor $\alpha_2$, the total current of the diode will amount to (1) $$I_R=\alpha_1 I_R+\alpha_2 I_R+I_{Co}$$

or (2) $$I_R=I_{Co}/(1-(\alpha_1+\alpha_2))$$

The diode current $I_R$ is thereby low for low values of the blocking current $I_{Co}$ and $\alpha_1+\alpha_2<1$, that is, the diode is at cutoff. It is accordingly essential for the cutoff or blocking of the diode (*a*) that the blocking current $I_{Co}$ of the p-n junction 2 is low up to a given operating voltage $U_Z$ at which is effected the breakthrough of the junction 2, and (*b*) that the sum of the current amplification factors $\alpha_1+\alpha_2$ is $<1$.

For the flipping of the diode from cutoff to flow or pass condition, for voltages which are higher or equal to $U_Z$, it is essential (*a*) That the blocking current $I_{Co}$ increases by multiplication of the charge carriers in the p-n layer 2, and (*b*) That the increasing blocking current effects an increase of the current amplification factors $\alpha_1$ and $\alpha_2$, so that their sum becomes greater or equal 1.

Flip flop diodes made of silicon and produced by the diffusion method exhibit the current dependence of the current amplification required for the functioning thereof. Alloyed junctions generally do not show this behavior, there being a great injection of charge carriers into the neighboring inner zone even in the presence of low currents. The present invention shows a way for obtaining, for example, even with alloyed junctions, a current amplification in accordance with the above stated requirements.

A similar arrangement known as Dynistror has in place of the last n-zone IV of the p-n-p-n diode, a zone produced by alloying tin-indium into p-conductive germanium. With the polarization of the voltage according to FIG. 1, such arrangement will exhibit the same characteristic as the p-n-p-n diode. However, when the polarity is reversed, there will not result any blocking or cutoff as in the arrangement of FIG. 1, but, with low breakthrough voltage of the junction 1, that is, a breakthrough voltage of about a few volts, a pronounced flow characteristic. Since the zone IV is p-doped by the indium, the contact 3 represents a pure ohmic contact.

The invention shows for these two arrangements a way of producing a current amplification which satisfies the previously noted requirements.

It is in accordance with the invention proposed that at least one, and particularly both of the outer zones IV and I bordering respectively on the inner zones III and II shall have lower conductivity than the respectively adjacent inner zone.

The operation of a diode constructed in this manner may be comprehended with reference to the current amplifying mechanism of a transistor. The shunt current amplification $\alpha$ of a transistor connected in base circuit can be subdivided into two factors $$\alpha=\gamma\cdot\beta$$

wherein $\gamma$=the emitter yield of a transistor. The emitter yield results from the factor that the charge carriers injected into the base zone of the transistor do not carry the entire emitter current but that a part, the socalled return current, is carried by charge carriers which are injected from the base into the emitter zone. The fraction of the emitter current which is carried by the charge carriers injected into the base zone is represented by $\gamma$, and $\beta$ represents the decrease of the charge carrier current injected into the base zone on the way through the base due to recombination.

As is known, the emitter yield depends upon the ratio of the conductivities of the base zone to the emitter zone ($\alpha_G/\alpha_E$), in the sense that it approaches the value 1 the more the smaller the ratio. An increasingly greater part of the entire emitter current is then carried by the charge carriers which are being injected from the emitter zone into the base zone. The emitter yield also depends upon the magntiude of the emitter current; it decreases with increasing emitter current.

The invention now proposes to make the conductivity of the emitter zone of one of the "transistors" or of both "transistors" of FIG. 2, of which the diode is composed, low, while making that of the base zone high. The number of majority carriers in the base zone will then be higher than the number of majority carriers in the emitter zone. The ratio $\alpha_B/\alpha_E$ is accordingly high, which is exactly opposite to the condition obtaining in a normal transistor. The result is that in the case of low emitter currents, the total current will be in the main transported by charger carriers which are respectively injected from the base zone II and III into the respective emitter zone I and IV. The emitter yield of the transistor and therewith its current amplification will then be very low. Upon increase of the total current due to surge ionization in the p-n layer 2, incident to exceeding a given voltage $U_Z$, the conductivity of the emitter zone will in known manner increase, thus also effecting increase of the emitter yield $\gamma$ as well as of the current amplification $\alpha$. The diode will flip from its blocking or cutoff condition to its conducting condition when the sum of the current amplification factors of the two transistors of FIG. 2 or the p-n junction 1 and 3 in FIGS. 3 and 4 becomes greater or equal to 1.

These considerations apply of course in a case when at least one of the two outer zones is of the same conduction type (p or n) as the respectively adjacent inner zone II or III. It is thereby moreover advantageous, in accordance with the teaching of copending application Serial No. 821,908, filed June 22, 1959, owned by the same assignee as in the present invention, when the corresponding outer zone is oppositely doped with impurity centers of opposite conduction type (n or p). The opposite doping must thereby be such that when the junction 1 and/or 3 are polarized in flow direction, there is effected an injection of minority carriers into the zones II and/or III. However, the opposing doping must not effect blocking of the junctions 2 and/or 3 upon reversal of polarization thereof.

It may moreover be advantageous in the utilization of the invention, to make the conductivity of the two inner zones II and III so high that the p-n junction can withstand only slight blocking voltages.

FIG. 3 shows a p-n-p-n diode made in accordance with known methods of germanium or silicon. The junction 2 can, for example, be produced by diffusion and the junctions 1 and 3 by alloying. According to the invention, both outer zones I and IV, for example, have lower conductivity than the two inner zones II and III, so that the arrangement exhibits the desired current dependence of $\alpha$.

In the arrangement according to FIG. 4, the outer zone IV, for example, has the same conduction type but lower conducitvity than the adjacent inner zone III and also lower conductivity than the inner zone II neighboring on the zone III. The zone I has a conduction type opposite to that of zone II and lower conductivity than zone II. The junction 2 can be produced, for example, by alloying into or diffusing into the structure an acceptor impurity, and the breakthrough of such junction may occur with low breakthrough voltage. The junction 3 may be produced, for example, by alloying-in indium-tin and if desired, in accordance with the teaching of the previously noted copending application, a slight addition (about 2%) or arsenic in germanium.

This arrangement as contrasted with FIG. 3, will not be blocked upon reversal of the voltage but will show a flow characteristic. Both outer zones may of course have the same conduction type and may exhibit lower conductivity than the two inner zones and may moreover be oppositely doped with impurity centers of the opposite conduction type.

Changes may be made within the scope and spirit of the appended claims which define what is believed to be new and desired to have protected by Letters Patent.

I claim:

1. A semiconductor arrangement, for switching and flip-flop circuits, having four serially related semiconducting zones of alternately different conduction type, a pair of terminal electrodes operatively connected to respective outermost zones, at least one of the two outer zones adjoining the respective inner zones having a lower conductivity than the respectively adjacent inner zone whereby a negative current-voltage characteristic is achieved.

2. A semiconductor arrangement, for swtiching and flip-flop circuits, having four serially related semiconducting zones of alternating different conduction type, a pair of terminal electrodes operatively connected respective outermost zones, each of the two outer zones adjoining the respective inner zones having a lower conductivity than the respectively adjacent inner zone whereby a negative current-voltage characteristic is achieved.

3. A semiconductor arrangement, for switching and flip-flop circuits, having four serially related semiconducting zones, at least the two inner zones of which are of different conduction type, a pair of terminal electrodes operatively connected to respective outermost zones, at least one of the two outer zones adjoining the respective inner zones having a lower conductivity than the respectively adjacent inner zone whereby a negative current-voltage characteristic is achieved.

4. A semiconductor arrangement according to claim 3, wherein said one outer zone has the same conduction type as the respectively adjacent inner zone but is oppositely doped with impurity centers of opposite conduction type.

5. A semiconductor arrangement, for switching and flip-flop circuits, having four serially related semiconducting zones, at least the two inner zones of which are of different conduction type, a pair of terminal electrodes operatively connected to respective outermost zones, each of the two outer zones adjoining the respectively adjacent inner zones having a lower conductivity than the respectively adjacent inner zone whereby a negative current-voltage characteristic is achieved.

6. An arrangement according to claim 5, wherein at least one of said outer zones has the same conduction type as the respectively adjacent inner zone but is oppositely doped with impurity centers of opposite conduction type.

References Cited in the file of this patent

UNITED STATES PATENTS

| | | |
|---|---|---|
| 2,623,105 | Shockley et al. | Dec. 23, 1952 |
| 2,793,145 | Clarke | May 21, 1957 |
| 2,811,653 | Moore | Oct. 29, 1957 |
| 2,816,847 | Shockley | Dec. 17, 1957 |
| 2,822,308 | Hall | Feb. 4, 1958 |
| 2,868,683 | Jochems et al. | Jan. 13, 1959 |
| 2,875,505 | Pfann | Mar. 3, 1959 |
| 2,878,152 | Runyan et al. | Mar. 17, 1959 |
| 2,910,634 | Rutz | Oct. 27, 1959 |

FOREIGN PATENTS

| | | |
|---|---|---|
| 707,008 | Great Britain | Apr. 7, 1954 |